US008368396B2

(12) United States Patent
Ueda

(10) Patent No.: US 8,368,396 B2
(45) Date of Patent: Feb. 5, 2013

(54) MAGNETIC SENSOR ELEMENT HAVING MULTI-MAGNETIC DOMAIN STRUCTURE, AND DETECTION APPARATUS EQUIPPED WITH SAME

(75) Inventor: Miki Ueda, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 520 days.

(21) Appl. No.: 12/596,944

(22) PCT Filed: Jun. 23, 2008

(86) PCT No.: PCT/JP2008/061790
§ 371 (c)(1),
(2), (4) Date: Oct. 21, 2009

(87) PCT Pub. No.: WO2009/001951
PCT Pub. Date: Dec. 31, 2008

(65) Prior Publication Data
US 2010/0148771 A1    Jun. 17, 2010

(30) Foreign Application Priority Data
Jun. 25, 2007    (JP) ................ 2007-166109

(51) Int. Cl.
*G01R 33/02* (2006.01)
*G01R 33/12* (2006.01)
*G01N 27/74* (2006.01)

(52) U.S. Cl. ...................... 324/249; 324/204

(58) Field of Classification Search .......... 324/249, 324/260, 204
See application file for complete search history.

(56) References Cited

U.S. PATENT DOCUMENTS

| 5,994,899 A | 11/1999 | Mohri .................. 324/260 |
| 6,727,692 B2 * | 4/2004 | Ciureanu et al. ........... 324/249 |

(Continued)

FOREIGN PATENT DOCUMENTS

| EP | 989411 | 3/2000 |
| WO | WO00/03260 | 1/2000 |

(Continued)

OTHER PUBLICATIONS

H. A. Ferreira et al., "Biodetection Using Magnetically Labeled Biomolecules and Arrays of Spin Valve Sensors", *J. Appl. Phys.*, vol. 93, No. 10, pp. 7281-7286 (2003).

(Continued)

*Primary Examiner* — Jay Patidar
(74) *Attorney, Agent, or Firm* — Fitzpatrick, Cella, Harper & Scinto

(57) ABSTRACT

This invention provides a magnetic sensor element that can detect a detection target substance with high accuracy. The magnetic sensor element includes a multi-magnetic domain structure in which a plurality of magnetic domains extend in a row in one direction and in which the magnetic domains that are adjoining have easy magnetization axes in opposite directions to each other. The multi-magnetic domain structure has a surface region. Within the surface region, when counting from one end of the multi-magnetic domain structure, affinities for a magnetic particle or a substance that can be immobilized on the magnetic particle are mutually different at a first surface portion located at a boundary between a $(2n-1)$th (n is a natural number) magnetic domain and a $(2n)$th magnetic domain and a second surface portion located at a boundary between the $(2n)$th magnetic domain and a $(2n+1)$th magnetic domain.

10 Claims, 13 Drawing Sheets

U.S. PATENT DOCUMENTS

| | | | |
|---|---|---|---|
| 2002/0135364 A1 | 9/2002 | Ciureanu et al. | 324/249 |
| 2003/0102863 A1* | 6/2003 | Wu | 324/244 |
| 2007/0040551 A1 | 2/2007 | Ciureanu et al. | 324/244 |

FOREIGN PATENT DOCUMENTS

| | | |
|---|---|---|
| WO | WO02/24930 | 4/2002 |

OTHER PUBLICATIONS

P.-A. Besse et al., "Detection of a Single Magnetic Microbead Using a Miniaturized Silicon Hall Sensor", *Appl. Phys. Lett.*, vol. 80, No. 22, pp. 4199-5001 (2002).

S. K. Lee et al., "Magnetic Gradiometer Based on a High-Transition Temperature Superconducting Quantum Interference Device for Improved Sensitivity of a Biosensor", *Appl. Phys. Lett.*, vol. 81, No. 16, pp. 3094-3097 (2002).

H. Chiriac et al., "Magnetic GMI Sensor for Detection of Biomolecules", *J. Magn. Magn. Mat.*, vol. 293, pp. 671-675 (2005).

S. Sandacci et al., "Off-Diagonal Impedance in Amorphous Wires and Its Application to Linear Magnetic Sensors", *IEEE Trans. Magn.*, vol. 40, No. 6, pp. 3505-3511 (2004).

J. Richardson et al., "A Novel Measuring System for the Determination of Paramagnetic Particle Labels for Use in Magneto-Immunoassays", *Biosensors & Bioelectronics*, vol. 16 pp. 1127-1132 (2001).

H. Hauser et al., "Giant Magnetoimpedance Sensors", *IEEE Instr. & Meas. Mag.*, pp. 28-32 (2001).

K. Mohri et al., "Amorphous Wire and CMOS IC-Based Sensitive Micromagnetic Sensors Utilizing Magnetic Impedance (MI) and Stress Impedance (SI) Effects", *IEEE Trans. Magn.*, vol. 38, No. 5, pp. 3063-3068 (2002).

L. Panina et al., "Magnetoimpedance in Amorphous Wires and Multifunctional Applications: From Sensors to Tunable Artificial Microwave Materials", *J Magn. Magn. Mat.*, vol. 272-276, pp. 1452-1459 (2004).

A.E. Mahdi et al., "Some New Horizons in Magnetic Sensing: High-$T_c$ SQUIDs, GMR and GMI Materials", *Sensors and Actuators A*, vol. 105, pp. 271-285 (2003).

M. Knobel et al., "Giant Magnetoimpedance: Concepts and Recent Progress", *J. Magn. Magn. Mat.*, vol. 242-245, pp. 33-40 (2002).

L.V. Panina et al., "Mechanism of Asymmetrical Magnetoimpedance in Amorphous Wires", *J. Appl. Phys.*, vol. 85, No. 8, pp. 5444-5446 (1999).

* cited by examiner

A STATE OF MAGNETIZATION IN CASE WHERE A DETECTED MAGNETIC FIELD IS 0

A STATE OF MAGNETIZATION IN CASE WHERE A DETECTED MAGNETIC FIELD IS SMALL

A STATE OF MAGNETIZATION IN CASE
WHERE A DETECTED MAGNETIC FIELD IS LARGE

THE RELATIONSHIP BETWEEN A DETECTED MAGNETIC
FIELD AND IMPEDANCE VARIATION PRODUCED BY
AN ALTERNATING CURRENT MAGNETIC FIELD

MAGNETIC SENSOR ELEMENT HAVING MULTI-MAGNETIC DOMAIN STRUCTURE, AND DETECTION APPARATUS EQUIPPED WITH SAME

TECHNICAL FIELD

The present invention relates to a magnetic sensor element for detecting a magnetic particle or a substance that can be immobilized on the magnetic particle. The present invention also relates to a detection apparatus equipped with the magnetic sensor element.

BACKGROUND ART

A radioimmunoassay method (radioimmunoassay (RIA) or immunoradiometric assay (IRMA)) has long been known as a quantitative immunoassay method. In this method, a competitive antigen or antibody is labeled with a radionuclide, and the antigen is quantitatively measured based on the measurement result of specific activity. That is, a target substance such as an antigen is labeled, and the target substance is indirectly measured. Because the radioimmunoassay method has high sensitivity, the method has greatly contributed to clinical diagnosis. However, because there are problems involved in handling radionuclides, a dedicated facility and apparatus are required when using the radioimmunoassay method.

Therefore, as a more workable method, for example, a method using labels such as fluorescent substances, enzymes, electrochemiluminescent molecules, or magnetic particles has been proposed. When using a fluorescent label, an enzyme label, an electrochemiluminescent label or the like as a label, detection of the target substance is performed by measuring the rate of absorption or transmittance of light or by measuring the light emission amount using an optical measurement method. Enzyme immunoassay (EIA) that uses enzymes as labels is a method in which, after carrying out an antigen-antibody reaction, enzyme-labeled antibody is caused to react, and a substrate for the enzyme is then added to cause color development, after which colorimetric determination is performed based on the absorbance.

Further, several research institutions have reported biosensors that use a magnetic sensor element to indirectly detect a biomolecular using a magnetic substance as a label. Various types of magnetic sensor elements can be used for this type of detection. Non-Patent Document 1 (H. A. Ferreira, et al, J. Appl. Phys., 93 7281 (2003)) describes a detection method using a magnetoresistance effect element. Non-Patent Document 2 (Pierre-A. Besse, et al, Appl. Phys. Lett. 80 4199 (2002)) describes a detection method using a Hall element. Non-Patent Document 3 (Seung Kyun Lee, et al, Appl. Phys. Lett. 81 3094 (2002)) describes a detection method using a Josephson element. Non-Patent Document 4 (Richard Luxton, et al, Anal. Chem. 16 1127 (2001)) describes a detection method using a coil. Non-Patent Document 5 (Horia Chiriac, et al, J. Magn. Magn. Mat. 293 671 (2005)) describes a detection method using an MI element (magneto-impedance element) in which the magnetoimpedance varies.

The detection methods for a biological substance using such elements have different characteristics. In particular, the MI element advantageously has a simple structure.

DISCLOSURE OF THE INVENTION

An MI element is made of a magnetic material of uniform composition or a nonmagnetic conductor coated with a magnetic material. A cylindrical MI element has an easy magnetization axis in a circumferential direction of a sensor cross section that is orthogonal to the longitudinal direction. A thin-film shaped MI element has an easy magnetization axis in a direction that is perpendicular to the longitudinal direction and is in-plane with the film. The MI element has a multi-magnetic domain structure that is magnetized along the easy magnetization axis direction.

FIG. 1 is a view that schematically illustrates an MI element that has a multi-magnetic domain structure. In FIG. 1, the MI element is a cylindrical sensor element that has a plurality of magnetic domains 1190 that have an easy magnetization axis in the circumferential direction of the sensor cross-section that is orthogonal to the longitudinal direction. An alternating-current power supply 2 is connected to both ends of the MI element. Between neighboring magnetic domains 1190, the inner-domain magnetization directions 1191 are in inverse directions to each other.

When an alternating current flows through the MI element, the electrons flow through the surface of the element because of the skin effect. If a magnetic field is applied in the direction of the easy magnetization axis to the element, the magnetic permeability of the element varies. Based on the variation $\Delta Z/Z$ in the impedance in the alternating current magnetic field, it is possible to measure the size of the magnetic field applied to the element. However, the magnetic field that is detected by the MI element is the magnetic field in the longitudinal direction of the element.

Further, for measuring the applied alternating current magnetic field, because of the frequencies produced by the skin effect on the element, a measurement method is available that has two measurement modes consisting of a high frequency mode and a low frequency mode. In the low frequency mode, magnetic domain wall motion occurs in the element accompanying the applied alternating current magnetic field. In contrast, in the high frequency mode, it is difficult for magnetic domain wall motion to arise, and magnetization rotation occurs.

FIGS. 2A to 2D are views for describing magnetic field measurement in a high frequency mode using an MI element. FIG. 2A is a view illustrating a state of magnetization in a case where a detected magnetic field is 0, FIG. 2B is a view illustrating a state of magnetization in a case where a detected magnetic field is small, and FIG. 2C is a view illustrating a state of magnetization in a case where a detected magnetic field is large. Further, FIG. 2D is a graph illustrating the relationship between a detected magnetic field and impedance variation produced by an alternating current magnetic field.

As illustrated in FIGS. 2A to 2C, as the detected magnetic field increases, the orientation of magnetization inside the magnetic domains rotates (magnetization rotation). As illustrated in FIG. 2D, the impedance variation $\Delta Z/Z$ produced by an alternating current magnetic field exhibits graph characteristics that are bilaterally symmetrical with respect to the time of a positive pole and the time of a negative pole.

Non-Patent Document 5 (Horia Chiriac, et al, *J. Magn. Magn. Mat.* 293 671 (2005)) describes a DNA detection method that uses an MI element. An MI element is coated with a polymer, and DNA having a desired base sequence is immobilized thereto via biotin. The MI element to which the DNA is immobilized is immersed in a solution containing magnetic particles. However, a DNA to be examined is previously immobilized to the magnetic particles via biotin. If the DNA to be examined, that is, the DNA immobilized to the magnetic particles in this case is complementary to the DNA immobilized to the surface of the MI element, the DNAs are bonded to each other, and therefore the magnetic particles are immobilized to the surface of the element. Since the MI element exhibits an impedance that depends on the stray magnetic field from the magnetic particles, whether the DNAs are complementary to each other or not can be indirectly detected.

As described in Non-Patent Document 5 (Horia Chiriac, et al, *J. Magn. Magn. Mat.* 293 671 (2005)), the impedance is measured with an electric circuit that has a fixed resistor and an alternating-current power supply connected in series with the MI element by measuring the voltage across the fixed resistor. The impedances measured before and after the magnetic particle is immobilized to the MI element are compared.

In magnetic field measurement using an MI element, as illustrated in FIG. 1, by allowing an alternating current of a frequency at which a skin effect is obtained to flow through a magnetic material in which the easy magnetization axis is in the circumferential direction, an alternating current magnetic field in the easy magnetization axis direction is applied along the surface of the element. At this time, the total of the effects of the magnetization of each magnetic domain wall inclining towards the easy axis produced by the detected magnetic field in the element length direction is measured as a change in impedance as illustrated in FIG. 2D. More specifically, in magnetic field measurement using an MI element, the sum of the effects of a detected magnetic field that are respectively received by each magnetic domain is obtained as the output.

Therefore, in magnetic field measurement after magnetic particles are immobilized to the surface of an MI element, when the relationship between the positions of the magnetic domains of the MI element and the attachment positions of the magnetic particles changes, there is a significant change in the detection sensitivity of the detection object. In particular, as described later, depending on the positional relation between magnetic particles and a magnetic domain, a state may result in which magnetic fields from magnetic particles cancel each other out in the magnetic domain, and even though magnetic particles are present, an impedance variation of the element can not be accurately detected.

An object of the present invention is to provide a magnetic sensor element that solves the above described problems and can detect a detection target substance (a magnetic substance or a substance that can be immobilized on a magnetic substance) at a high accuracy, and a detection apparatus that uses the element.

A magnetic sensor element according to the present invention includes a multi-magnetic domain structure in which a plurality of magnetic domains extend in a row in one direction and in which the magnetic domains that are adjoining have easy magnetization axes in opposite directions to each other, characterized in that:

the multi-magnetic domain structure includes a surface region, and within the surface region, when counting from one end of the multi-magnetic domain structure, affinities for a magnetic particle or a substance that can be immobilized on the magnetic particle are mutually different at a first surface portion located at a boundary between a (2n−1)th (n is a natural number) magnetic domain and a (2n)th magnetic domain and a second surface portion located at a boundary between the (2n)th magnetic domain and a (2n+1)th magnetic domain.

A magnetic sensor element according to another aspect of the present invention includes a multi-magnetic domain structure in which a plurality of magnetic domains are adjacently formed in one direction, in which each of the plurality of magnetic domains has an easy magnetization axis in a predetermined direction that intersects with the one direction, characterized in that, among a plurality of magnetic domain walls formed at respective boundaries of the plurality of magnetic domains, an affinity for a detection target substance at a surface of the magnetic sensor element is different at a portion of a magnetic domain wall positioned at an odd-numbered position and a portion of a magnetic domain wall positioned at an even-numbered position when counting from one end of the multi-magnetic domain structure.

A magnetic sensor element according to a further aspect of the present invention includes a multi-magnetic domain structure in which a plurality of magnetic domains are adjacently formed in one direction, in which each of the plurality of magnetic domains has an easy magnetization axis in a predetermined direction that intersects with the one direction, characterized in that, the magnetic sensor element has a third surface portion with different surface properties between a first surface portion of the sensor element on a magnetic domain wall at a (2n−1)th (n is a natural number) position and a second surface portion of the sensor element on a magnetic domain wall at a (2n+1)th (n is a natural number) position when counting from one end of the multi-magnetic domain structure.

According to the present invention, an adherence position of a magnetic particle that adheres to a magnetic sensor element can be defined.

More specifically, it is possible to reduce the occurrence of a state in which magnetic fields applied to a multi-magnetic domain structure from magnetic particles cancel each other out within a magnetic domain. As a result, highly accurate detection of a detection target substance is achieved.

Further features of the present invention will become apparent from the following description of exemplary embodiments with reference to the attached drawings.

BRIEF DESCRIPTION OF THE DRAWINGS

FIGS. 4A and 4B are views for describing a structure in the magnetic domain wall surface vicinity of the magnetic sensor element illustrated in FIG. 3, in which FIG. 4A is a schematic diagram that illustrates a state in the vicinity of a magnetic domain wall surface on which a magnetic particle immobilizing film is formed, and FIG. 4B is a schematic diagram illustrating a state in the vicinity of a magnetic domain wall surface on which a magnetic particle non-immobilizing film is formed;

BEST MODES FOR CARRYING OUT THE INVENTION

Next, an exemplary embodiment of the present invention is described with reference to the drawings.

Figure 15A:
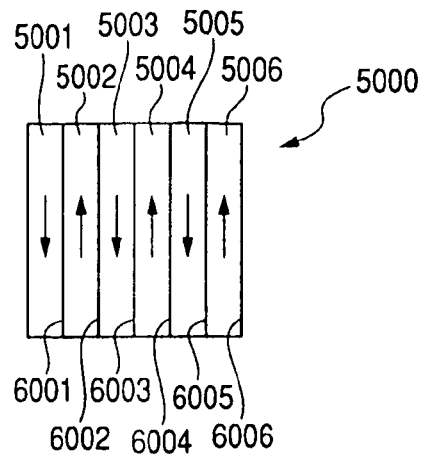
FIGS. 15A, 15B and 15C are views for describing a magnetic sensor element according to the present invention.
Figure 15B:
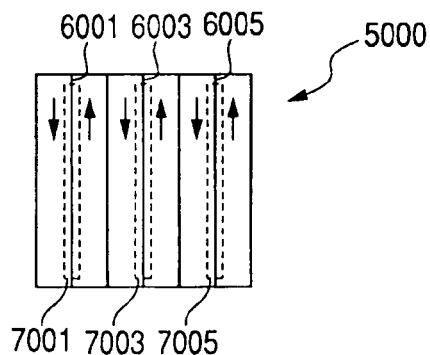
Figure 15C:
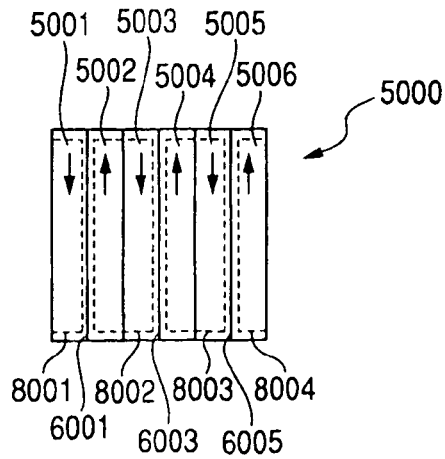

FIGS. 15A to 15C are conceptual diagrams for describing a magnetic sensor element according to the present invention.

FIG. 15A illustrates a state in which a magnetic sensor element includes a multi-magnetic domain structure 5000 in which a plurality of magnetic domains (5001 to 5006) extend in a row in one direction and in which the magnetic domains that are adjoining have easy magnetization axes (illustrated by arrows in the figure) in opposite directions to each other. Reference numerals 6001 to 6006 denote boundaries between magnetic domains. These are sometimes referred to as "magnetic domain walls".

The multi-magnetic domain structure 5000 has a surface region.

In this case, the term "surface region" refers to the surface of the multi-magnetic domain structure, and is the entire surface including magnetic domains 5001 to 5006.

Within the surface region, portions located at boundaries (6001, 6003, 6005) between (2n−1)th (n is a natural number) magnetic domains (5001, 5003, 5005) and (2n)th magnetic domains (5002, 5004, 5006) when counting from one end of the multi-magnetic domain structure 5000 are first surface portions. (In this connection, the one end is illustrated as the left end in the figure.)

Further, portions located at boundaries (6002, 6004, 6006) between (2n)th magnetic domains (5002, 5004, 5006) and (2n+1)th magnetic domains (5003, 5005) are second surface portions.

A feature of the present invention is that, an affinity of a first surface portion and an affinity of a second surface portion with respect to a magnetic particle or a substance that can be immobilized on the magnetic particle are mutually different.

By making the affinities of the first surface portion and the second surface portion different, it is possible to facilitate adherence of a magnetic particle or a substance that can be immobilized on the magnetic particle as a detection target to one of the first surface portion and the second surface portion.

More specifically, as illustrated in FIG. 15B, for example, magnetic particle immobilizing films (not illustrated) are provided at first surface portions (areas 7001, 7003, and 7005 that are enclosed by dotted lines) of the multi-magnetic domain structure 5000 including boundaries 6001, 6003, and 6005 between magnetic domains.

Alternatively, as illustrated in FIG. 15C, magnetic particle non-immobilizing films (not illustrated) are provided at areas 8001, 8002, 8003, and 8004 including boundaries (6002, 6004) other than the boundaries 6001, 6003, and 6005 between magnetic domains.

Naturally, the concepts illustrated in FIG. 15B and FIG. 15C can also be used in combination.

A film for selectively adhering the magnetic particles or the substances that can be immobilized on the magnetic particles to the surface of the multi-magnetic domain structure, as typified by a magnetic particle immobilizing film, can be provided on the first surface portions.

Further, a film that inhibits adherence of the magnetic particles or the substances that can be immobilized on the magnetic particles to the surface of the multi-magnetic domain structure, as typified by a magnetic particle non-immobilizing film, can be provided on the second surface portions.

FIG. 15B and FIG. 15C describe a technique that facilitates adherence of the relevant detection target to the first surface portions. Naturally, the present invention does not exclude facilitating adherence of the relevant detection target to the second surface portions instead of the first surface portions.

Thus, by selectively adhering a detection target substance to one of the first surface portion and the second surface portion, it is possible to avoid a decrease in measurement accuracy that accompanies variations in adherence positions.

Figure 1:
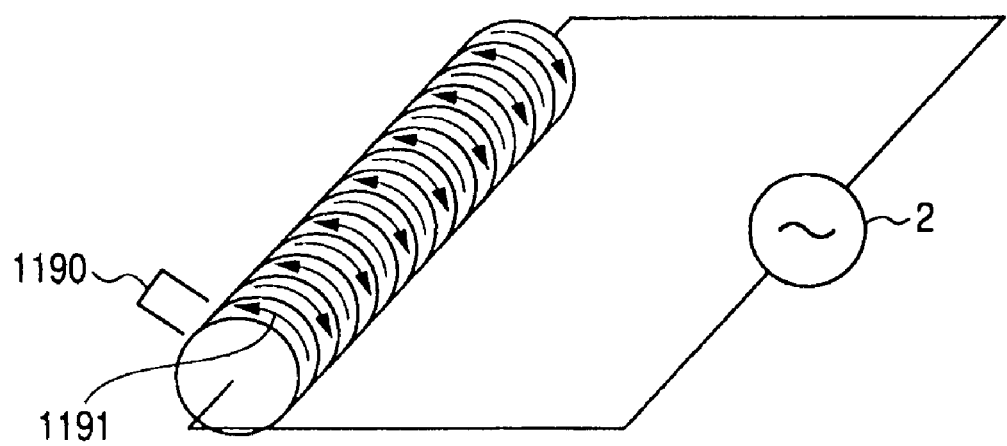
FIG. 1 is a schematic diagram illustrating an MI element that has a multi-magnetic domain structure.
Figure 2A:
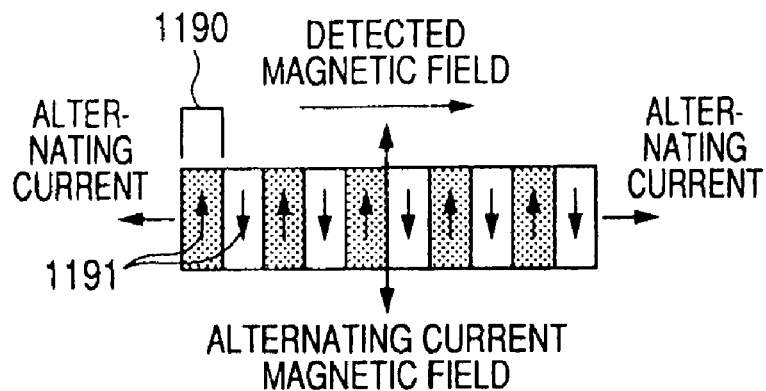
FIGS. 2A, 2B, 2C and 2D are views for describing magnetic field measurement in a high frequency mode using an MI element.
Figure 2B:
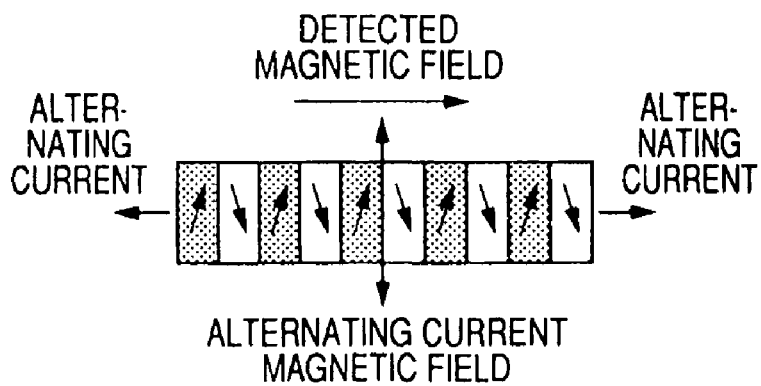
Figure 2C:
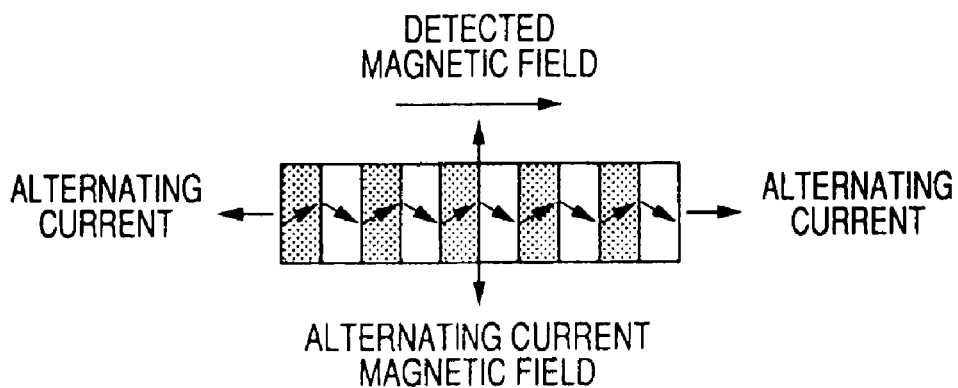
Figure 2D:
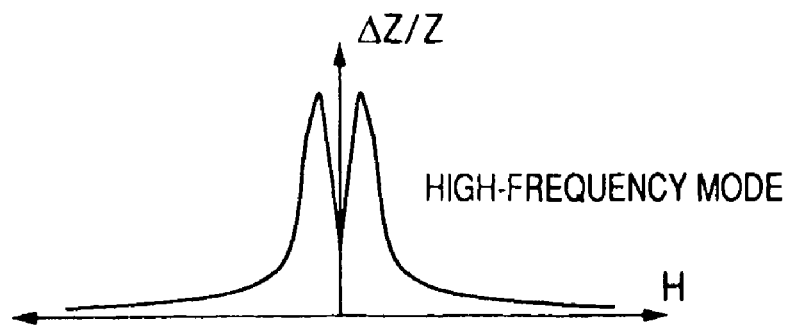
Figure 3:
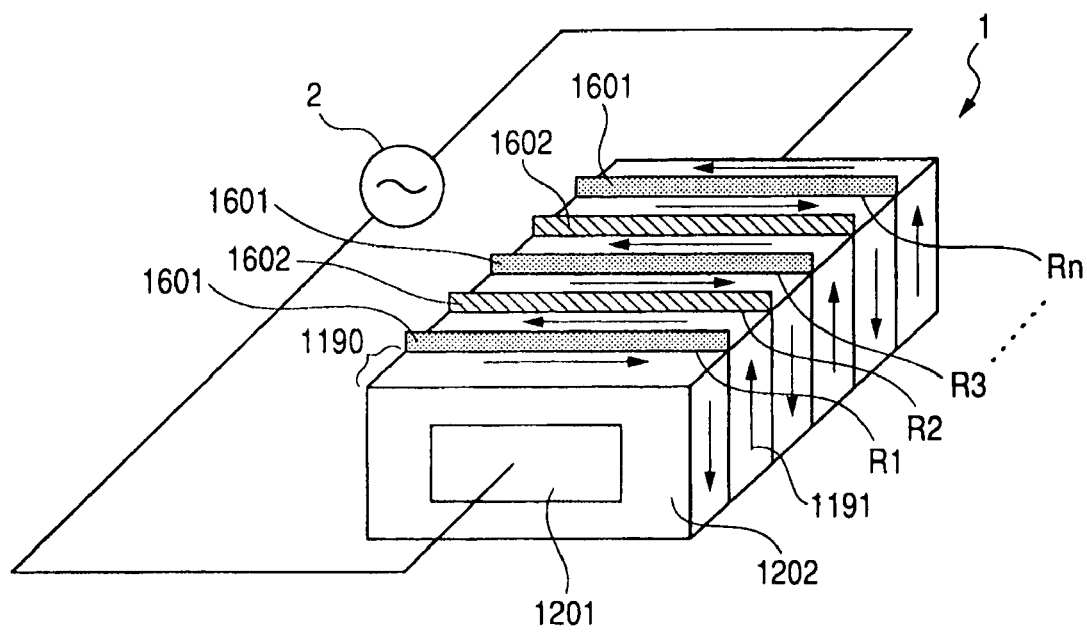
FIG. 3 is a schematic diagram illustrating the structure of a magnetic substance detection apparatus including a magnetic sensor element that is one exemplary embodiment of the present invention.

FIG. 3 is a schematic diagram of a detection apparatus for detecting a magnetic substance that includes a magnetic sensor element as one exemplary embodiment of the present invention.

Referring to FIG. 3, the magnetic substance detection apparatus has, as principal parts, an MI element 1 that is a magnetic sensor element, and an alternating-current power supply 2 for feeding an alternating current to the MI element 1.

For the MI element 1, an amorphous magnetic wire including CoSiB, FeCoSiB, FeCoMoSiB or the like or, to improve the detection sensitivity, an element formed with a nonmagnetic conductive material at the center of a magnetic wire can be used.

The cross-sectional shape (plane cut in a direction intersecting with the longitudinal direction) of the MI element 1 is not particularly limited, and the cross-sectional shape may be any shape as long as a magnetic field in the longitudinal direction can be detected. The cross-sectional shape of the MI element 1 may be, for example, one of a circular shape and a polygonal shape. When the cross-sectional shape is a polygonal shape, the MI element 1 has a shape that is point-symmetric about the center point of the cross section thereof. Further, the MI element 1 is not limited to a columnar element, and may be an element that has a thin film structure.

In the example illustrated in FIG. 3, the MI element 1 has a square columnar shape, and the alternating-current power supply 2 is connected at both ends thereof. In the MI element 1, a multi-magnetic domain structure is formed that includes a plurality of magnetic domains 1190 having an easy magnetization axis in the circumferential direction (predetermined direction) of a cross-section in a direction perpendicular to the longitudinal direction. Between neighboring magnetic domains 1190, the magnetization directions within the respective magnetic domains are in mutually opposite directions. A magnetic domain wall is formed at a boundary of each magnetic domain 1190.

For example, for magnetic field measurement in a high frequency mode, the magnetic domain wall portion surface vicinity of MI element 1 is defined as region R1, region R2, . . . region Rn in order from one end face. Among these regions, the affinity for a detection target substance (magnetic particle or substance that can be immobilized on a magnetic particle) differs between a magnetic domain wall surface vicinity 1601 that is an odd-numbered region (region indicated by cross-hatching) and a magnetic domain wall surface vicinity 1602 that is an even-numbered region (region indicated by dots). A magnetic particle is a magnetic substance, and a substance that can be immobilized on a magnetic particle is a non-magnetic substance (biological substance). In this case, the magnetic domain wall surface vicinity 1601 is taken to be a region with a high affinity, while the affinity in the magnetic domain wall surface vicinity 1602 is taken as being low in comparison to the magnetic domain wall surface vicinity 1601. The affinity may gradually change from the magnetic domain wall surface vicinity 1601 to the magnetic domain wall surface vicinity 1602. Further, the affinity may differ locally in each of the magnetic domain wall surface vicinities 1601 and 1602.

A film is formed on the surface of the MI element 1 using a film formation technique such as sputtering, plating, or vapor deposition to make the film structure on the surface of the element differ between an odd-numbered magnetic domain wall surface vicinity and an even-numbered magnetic domain wall surface vicinity. It is thereby possible to make the affinity for a magnetic particle or a substance that can be immobilized on a magnetic particle vary between the magnetic domain wall surface vicinity 1601 and the magnetic domain wall surface vicinity 1602. At this time, it is also effective to use a mask according to the magnetic domain structure of the MI element 1. By gradually changing the thickness or the composition of the film formed on the surface of the MI element 1, the affinity for the magnetic particle or the substance that can be immobilized on the magnetic particle can be made to differ between an odd-numbered magnetic domain wall surface vicinity and an even-numbered magnetic domain wall surface vicinity.

Alternatively, a film may be formed using a material having a higher (or lower) affinity for the magnetic particle or the substance that can be immobilized on the magnetic particle so as to obtain the thickest film thickness in the odd-numbered magnetic domain wall surface vicinity. In this case, film formation can be performed using collimate sputtering, selective sputtering or the like. As another technique, an MI element can be embedded in a housing and the above described film structure can be implemented on an exposed sensor face.

Figure 4A:
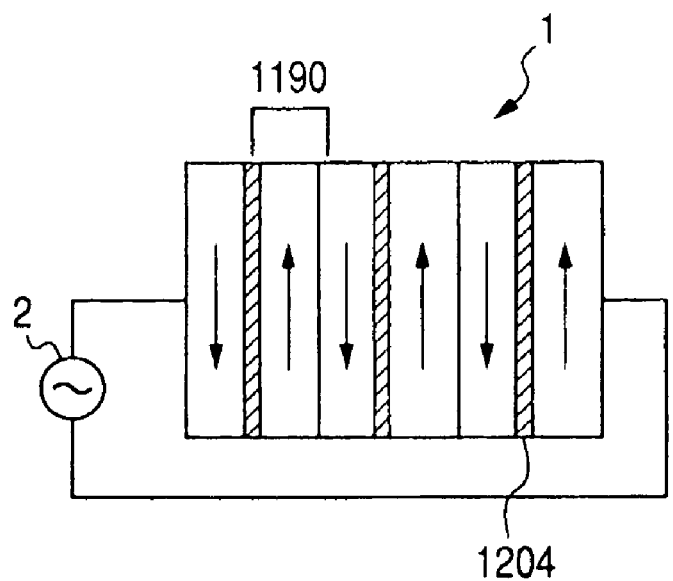
Figure 5A:
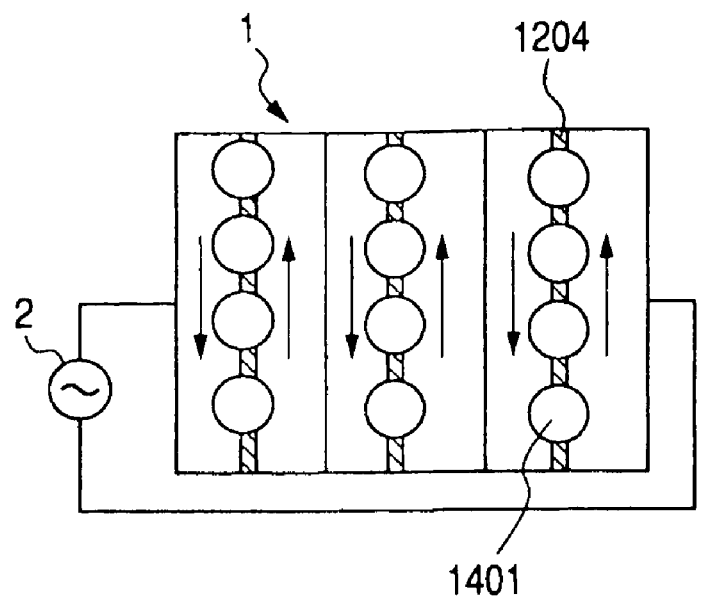
FIG. 5A is a schematic diagram illustrating a state in which magnetic particles are adhered to the magnetic particle immobilizing film illustrated in FIG. 4A.

In the example illustrated in FIG. 4A, a magnetic particle immobilizing film 1204 including a material with a high affinity for the magnetic particle or a substance that can be immobilized on the magnetic particle is formed only in the magnetic domain wall surface vicinity 1601. The magnetic particle immobilizing film 1204 is not formed in the magnetic domain wall surface vicinity 1602. By forming a film in this manner, as illustrated in FIG. 5A, magnetic particles 1401 are immobilized only at the magnetic domain wall surface vicinity 1601.

Figure 4B:
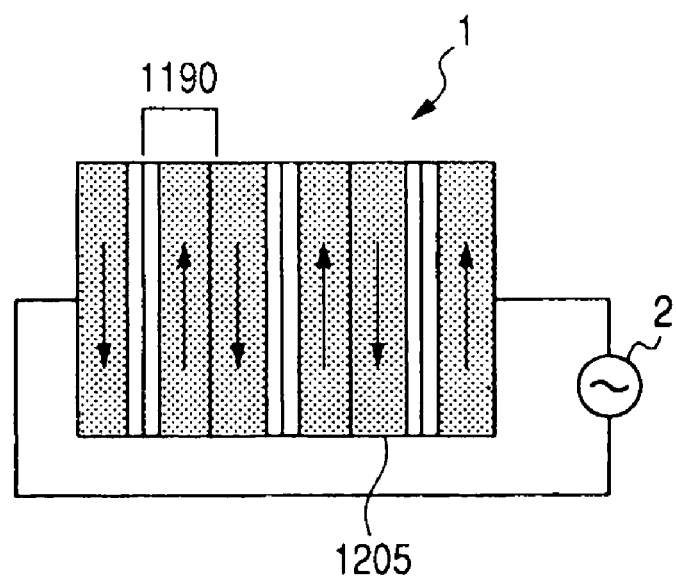
Figure 5B:
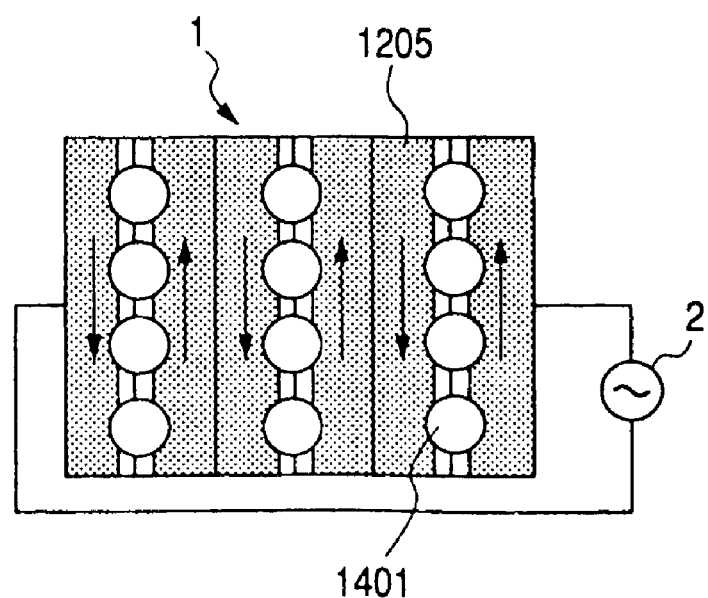
FIG. 5B is a schematic diagram illustrating a state in which magnetic particles are adhered to a portion other than the magnetic particle non-immobilizing film illustrated in FIG. 4B.

According to the example illustrated in FIG. 4B, a magnetic particle non-immobilizing film 1205 including a material with a low affinity for the magnetic particle or a substance that can be immobilized on the magnetic particle is formed at areas excluding the magnetic domain wall surface vicinity 1601 on the surface of the element. By forming a film in this manner, as illustrated in FIG. 5B, magnetic particles 1401 are immobilized only at the magnetic domain wall surface vicinity 1601.

Next, a detailed description is given of the magnetic field intensity of a longitudinal component of the element that is detected with an MI element on which the magnetic particle immobilizing film 1204 illustrated in FIG. 4A or the magnetic particle non-immobilizing film 1205 illustrated in FIG. 4B is formed.

Figure 6:
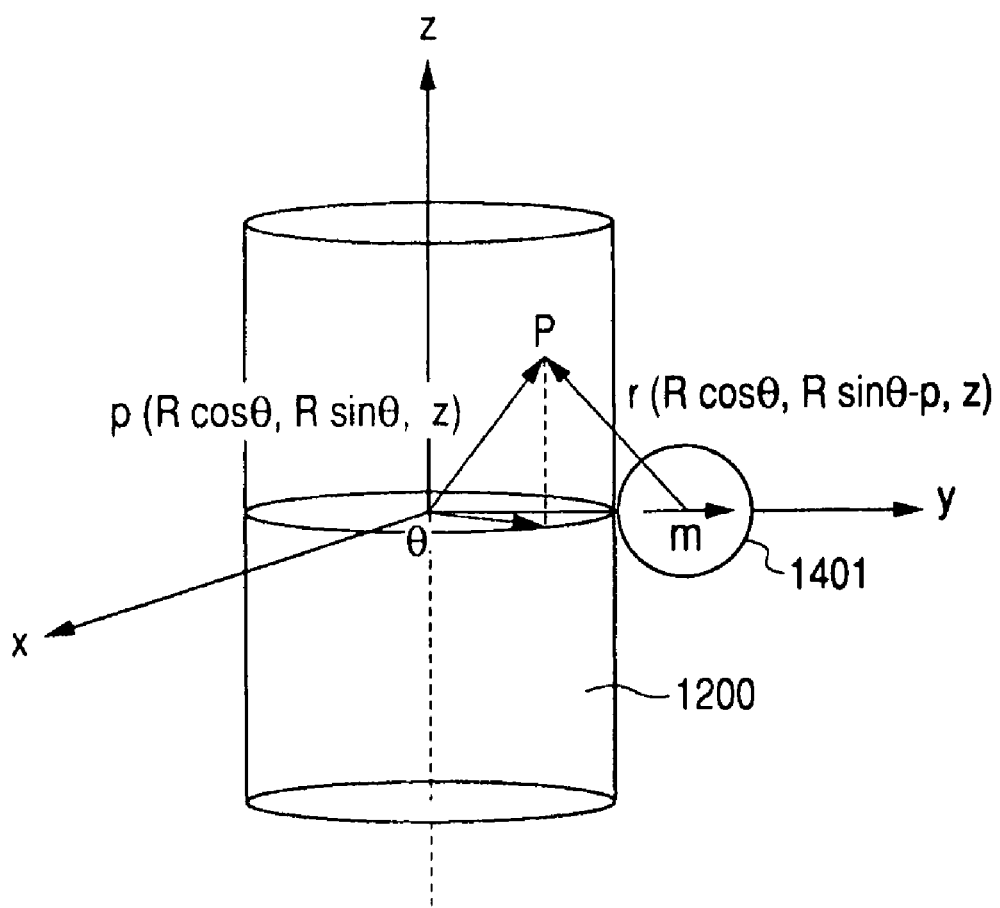
FIG. 6 is a schematic diagram for describing the magnetic field intensity of a longitudinal component of the element that is detectable with the MI element.

FIG. 6 is a schematic diagram for describing the magnetic field intensity of a longitudinal component of the element that is detectable with the MI element. Referring to FIG. 6, a single magnetic particle 1401 having a magnetization m is immobilized on a cylindrical MI element 1200. The longitudinal direction of the element is taken to be the Z direction. One direction of a plane that is perpendicular to the longitudinal direction of the element at a place where the magnetic particle 1401 contacts is taken to be the X direction and the other direction is taken to be the Y direction. A stray magnetic field $H_s$ generated by the magnetic particle 1401 at a point P on the MI element 1200 is expressed by the following formula (1).

(Formula 1)

$$H_S = -\frac{1}{4\pi\mu_0 r^3}\left[m - \frac{3}{r^2}(mr)r\right] \quad (1)$$

Here, solving the formula (1), a surface integral of the magnetic field intensity $|H_s(z)|$ of a detectable longitudinal component of the element is obtained and described as $H_s$sum.

Figure 7A:
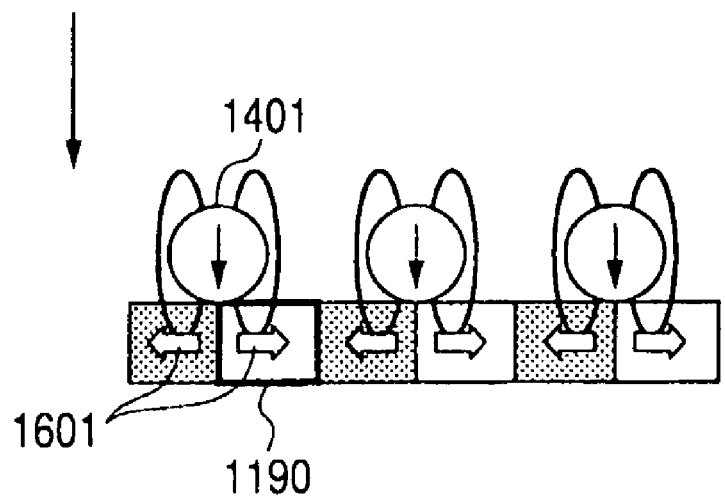
FIG. 7A is a schematic diagram that illustrates the state of magnetic fields of longitudinal components of the element in a case in which magnetic particles are present only in the vicinity of surfaces of odd-numbered or even-numbered magnetic domain walls.
Figure 7B:
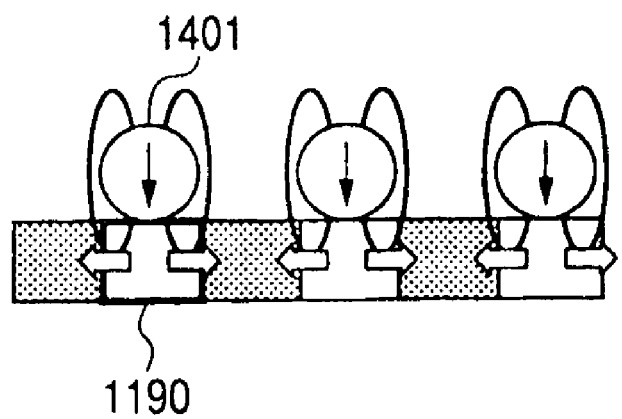
FIG. 7B is a schematic diagram that illustrates the state of magnetic fields of longitudinal components of the element in a case in which magnetic particles are present around the center of magnetic domains.

FIG. 7A illustrates the state of magnetic fields of longitudinal components of the element in a case where magnetic particles 1401 are only present in the vicinity of odd-numbered or even-numbered magnetic domain wall surfaces. FIG. 7B illustrates the state of magnetic fields of longitudinal components of the element in a case where magnetic particles 1401 are present at the vicinity of the center of magnetic domains. The value of $H_s$sum differs significantly between the state illustrated in FIG. 7A (hereafter referred to as "state A") and the state illustrated in FIG. 7B (hereafter referred to as "state B"). Hereunder, the magnetic domains that are the nearest neighbors to the magnetic particles and which receive the most influence from the magnetic particles are described.

In this case, it is assumed that state A is a state in which magnetic particles are present only in the vicinity of odd-numbered magnetic domain wall surfaces. In state A, the magnetic domains that are the nearest neighbors to a magnetic particle are the first and second magnetic domains that sandwich the odd-numbered magnetic domain walls. Although magnetic fields that the first and second magnetic domains receive from the magnetic particle are in opposite directions to each other in a condition in which the magnetic domain wall acts as the boundary, the direction of the magnetic field within each magnetic domain is the same.

In contrast, in state B, magnetic fields that a magnetic domain that is the nearest neighbor to a magnetic particle receives from the magnetic particle are in opposite directions to each other in a condition in which a cross section of the element that includes a contact point between the magnetic particle and the MI element acts as the boundary. Therefore, within the magnetic domain, the magnetic fields from the magnetic particle act so as to cancel each other out. As a result, the $H_s$ in the opposite directions are added together within a single magnetic domain such that the magnetic field received by the magnetic domain that is nearest the magnetic particle decreases.

As will be understood from the above description, in the case of state A, since magnetic fields are not cancelled out within the magnetic domains, the magnetic field detection sensitivity increases. In contrast, in the case of state B, since magnetic fields cancel each other out within a magnetic domain, the magnetic field detection sensitivity is lowered. In this connection, a plurality of magnetic particles 1401 may be adhered in the vicinity of odd-numbered or even-numbered magnetic domain wall surfaces.

Figure 8A:
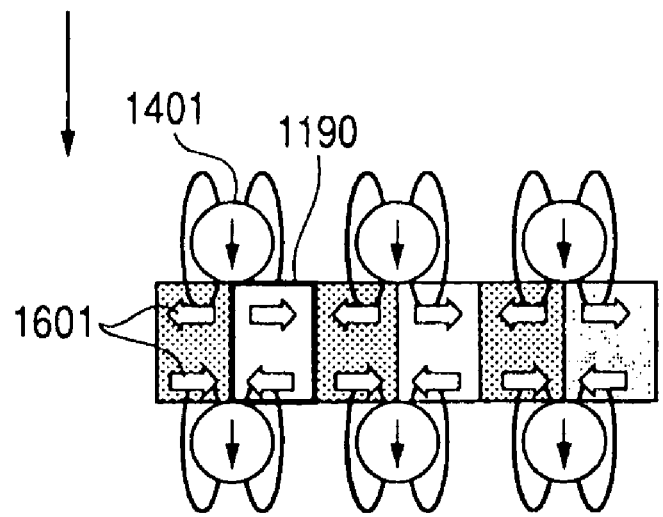
FIG. 8A is a schematic diagram that illustrates another form of a state in which magnetic fields inside a magnetic domain cancel each other out.

Another example of a state in which magnetic fields cancel each other out within a magnetic domain will now be described. FIG. 8A illustrates a state of magnetic fields of longitudinal components of the element in a case in which magnetic particles 1401 are adhered in the vicinity of opposing magnetic domain wall surfaces of odd-numbered or even-numbered magnetic domain walls. In this state, since a magnetic field from a magnetic particle adhered to one side and a magnetic field from a magnetic particle adhered to the other side cancel each other out within the same magnetic domain, the magnetic field detection sensitivity decreases.

Figure 8B:
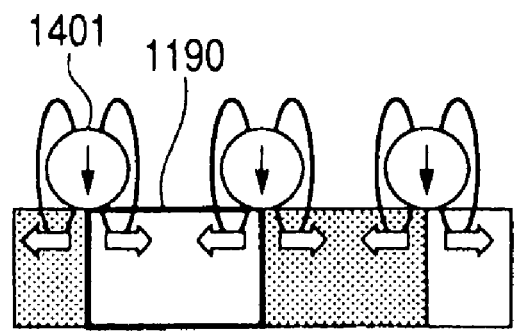
FIG. 8B is a schematic diagram that illustrates a further form of a state in which magnetic fields inside a magnetic domain cancel each other out.

A further example of a state in which magnetic fields cancel each other out within a magnetic domain is illustrated in FIG. 8B. FIG. 8B illustrates a state of magnetic fields of longitudinal components of the element in a case in which magnetic particles 1401 are adhered in the magnetic domain wall surface vicinity of each odd-numbered and even-numbered magnetic domain wall. In this state, within the same magnetic domain, since the magnetic field from a magnetic particle adhered to the wall portion surface at one side and the magnetic field from a magnetic particle adhered to the wall portion surface at the other side cancel each other out, the magnetic field detection sensitivity decreases.

Although more minute conditions influence the actual output of the MI element, as illustrated in FIG. 7A, a high output is obtained by adopting a structure whereby magnetic particles are adhered only in the vicinity of odd-numbered (or even-numbered) magnetic domain wall surfaces.

At the time of detection of magnetic particles, by setting the magnetization of the magnetic particles in a certain direction by applying a static magnetic field from outside and then performing detection, it is possible to realize circumstances that are similar to the above described computation model even when detecting magnetic particles with a soft magnetism. In state A, since detection of magnetic particles at a high sensitivity is possible, magnetic particles that produce a smaller magnetic field can also be detected.

As long as the desired magnetic field can be applied, a static magnetic field applying unit may be of any kind. For example, the static magnetic field applying unit may be a permanent magnet or an electromagnet. The application direction of the static magnetic field may be any direction, as long as magnetic particles are detectable. A direction perpendicular to the longitudinal direction of the MI element is considered to be a direction in which detection of magnetic particles is difficult. By applying a static magnetic field in the aforementioned perpendicular direction it is possible to avoid saturating the sensitivity of the MI element.

The foregoing chiefly described a case in which a single magnetic particle is immobilized on the MI element surface. However, the same situation applies in a case in which a plurality of magnetic particles is immobilized on the MI element surface.

A region (flux pinning region) at which magnetization is fixed can be formed at a specific position of the MI element or, alternatively, the magnetic domain structure of the MI element can be controlled utilizing a film formation effect at the time of application of a high-frequency magnetic field to more accurately realize an arrangement that is near to the state A.

It is sufficient that the measurement conditions are those under which the above described effects are obtained, and the measurement conditions are not limited to measurement in a high frequency mode.

An apparatus that detects magnetic particles using the MI element may have a structure in which, as described in Non-Patent Document 5, an alternating-current power supply and a fixed resistor are connected in series with the MI element, and a voltmeter that detects a voltage is connected to both ends of the fixed resistor.

The multi-magnetic domain structure according to the present invention, for example, includes a columnar magnetic material in which the plurality of magnetic domains is formed along the longitudinal direction of the magnetic material, and has the easy magnetization axis in a circumferential direction at a cross section that cuts the magnetic material in a direction intersecting with the longitudinal direction. The multi-magnetic domain structure may include a magnetic film formed on a substrate, with the plurality of magnetic domains formed in the one direction in the in-plane direction of the magnetic film, so as to have the easy magnetization axis in a direction intersecting with the one direction.

A magnetic sensor element according to another aspect of the present invention has the following characteristics.

Specifically, the magnetic sensor element includes a multi-magnetic domain structure in which a plurality of magnetic domains are adjacently formed in one direction, and in which each of the plurality of magnetic domains has an easy magnetization axis in a predetermined direction that intersects with the one direction, characterized by having the following characteristics with respect to the surface properties of the element.

The magnetic sensor element has a third surface portion between a first surface portion of the sensor element on a Magnetic domain wall at a (2n−1)th (n is a natural number) position and a second surface portion of the sensor element on a magnetic domain wall at a (2n+1)th (n is a natural number) position when counting from one end of the multi-magnetic domain structure. In this case, the surface properties (for example, affinity for a magnetic particle or a non-magnetic substance such as a living organism) of the third surface portion are different to the surface properties of the first and the second surface portions. The third surface portion is, for example, provided principally on a magnetic domain wall at a (2n)th (n is a natural number) position. The surface properties need not necessarily be only the affinity for a substance, and may be differences in the shape of surface roughness or the like, and are not particularly limited as long as a detection target substance can be selectively detected as a result.

Example 1

Figure 9:
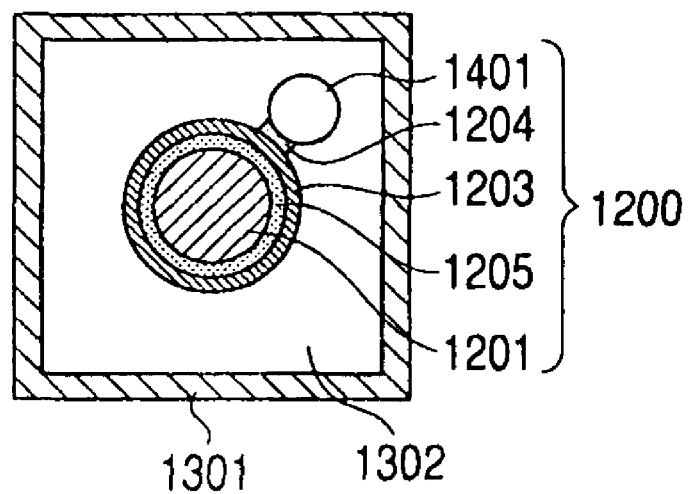
FIG. 9 is a schematic diagram that illustrates the structure of an immunosensor as a first example of the present invention.

FIG. 9 illustrates the structure of an immunosensor as a first example of the present invention. An MI element 1200 forming the immunosensor includes a nonmagnetic conductor 1201 made of Cu and having a diameter ϕ of 15 µm. The surface of the nonmagnetic conductor 1201 is coated with a magnetic film 1205 made of FeCoSiB and having a thickness of 7.5 µm.

In a case where an alternating current of 40 MHz is applied to the nonmagnetic conductor 1201, a magnetic particle immobilizing film 1204 made of Au and having a thickness of 20 nm is formed in the odd-numbered magnetic domain wall surface vicinity 1601 of the magnetic domain structure formed in the MI element 1200, when counting from a sensor end face on one side.

An insulating thin film 1203 made of $SiO_2$ and having a thickness of 50 nm is formed between the magnetic particle immobilizing film 1204 and the magnetic film 1205. However, the material and the thickness of each part forming the MI element 1200 are not limited to those described above, and any structure may be adopted for the MI element 1200 as long magnetic particles can be detected.

The MI element 1200 is housed in a flow channel 1302 inside a housing 1301 with the two ends thereof in a supported state. The total length of the MI element 1200 is approximately 6 mm. Although in FIG. 9 the MI element 1200 is illustrated as a single linear element, the MI element 1200 is not limited thereto. The MI element 1200 may be folded inside the flow channel.

Figure 10:
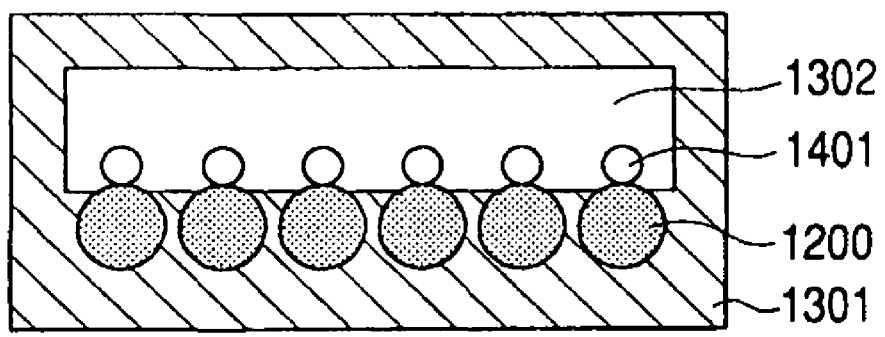
FIG. 10 is a schematic diagram illustrating a different housing state of the MI element illustrated in FIG. 9.

The form of housing the MI element 1200 is not limited to the structure illustrated in FIG. 9. FIG. 10 illustrates a different form of housing the MI element 1200. Referring to FIG. 10, a flow channel 1302 with a quadrilateral cross-sectional shape is included inside the housing 1301. A plurality of MI elements 1200 is embedded in an inner wall portion of the housing 1301. One portion of the surface of each MI element 1200 is slightly exposed in the flow channel 1302.

Figure 11:
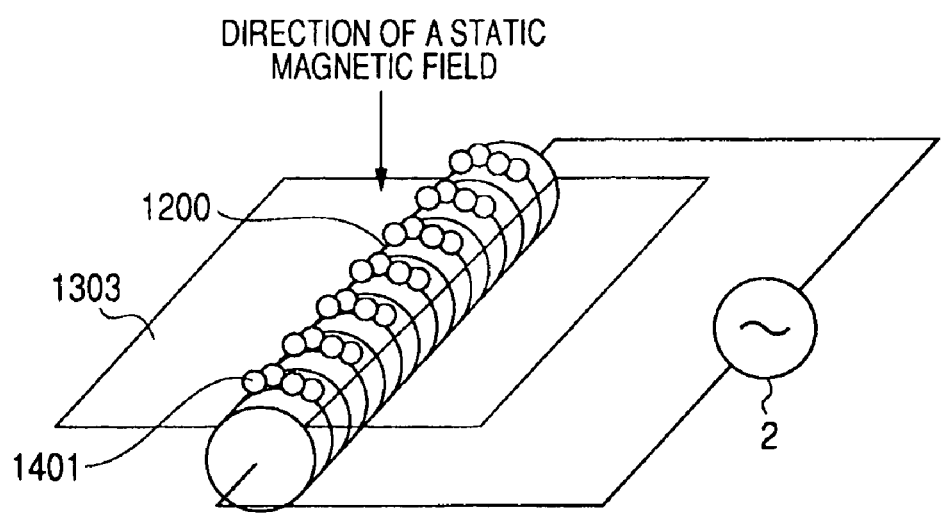
FIG. 11 is a schematic diagram illustrating a state in which one portion of the surface of the MI element illustrated in FIG. 10 is slightly exposed inside a flow channel.

FIG. 11 schematically illustrates a state in which one portion of the surface of the MI element is slightly exposed inside the flow channel. In this example, of the entire surface of the MI element 1200, the surface at one portion extending entirely along the longitudinal direction is exposed in the flow channel. A wall portion (flow channel wall) of the flow channel 1302 is formed by a housing surface 1303 that is an inner wall of the housing 1301. An alternating current is supplied from the alternating-current power supply 2 to both ends of the MI element 1200. A static magnetic field is applied in a perpendicular direction to the housing surface 1303. A magnetic particle 1401 is adhered to the surface of the MI element 1200 that is exposed inside the flow channel 1302.

According to the housing form in which the MI element 1200 is embedded inside the housing 1301 in this manner, it is possible to prevent the magnetic particle 1401 from adhering to a position that is linearly symmetrical with respect to the long axis of the MI element 1200.

A housing form that embeds the MI element 1200 inside the housing 1301 is not limited to the structure illustrated in FIG. 10. The flow channel inside the housing 1301 may be provided as a flow channel having a circular cross-sectional shape, and the plurality of MI elements 1200 may be embedded within the wall portion of the housing 1301 so that one portion of the surface of each MI element 1200 is slightly exposed in the flow channel 1302. Further, the magnetic sensor element may be embedded in the inner wall of the housing so as to expose a portion of the surface along the longitudinal direction of the magnetic sensor element in the flow channel.

Figure 12:
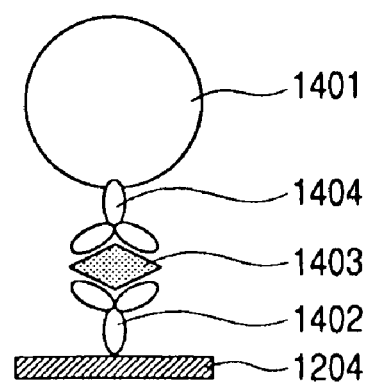
FIG. 12 is a schematic diagram illustrating a state in which a magnetic particle is adhered to a magnetic particle immobilizing film by an antigen-antibody reaction.

FIG. 12 schematically illustrates a state in which a magnetic particle is adhered on a magnetic particle immobilizing film by an antigen-antibody reaction. Referring to FIG. 12, the magnetic particle 1401 is immobilized on the magnetic particle immobilizing film 1204 through a primary antibody 1402, an antigen 1403, and a secondary antibody 1404. The antigen 1403 is, specifically, prostate specific antigen (PSA), which is known as a marker of prostate cancer.

Detection of prostate specific antigen (PSA) as the antigen 1403 is performed according to the following protocol at the immunosensor.

(1) The primary antibody 1402 that recognizes the antigen (PSA) 1403 is immobilized on the surface portion of the MI element 1200 that is exposed in the flow channel 1302. A phosphate buffered saline (detection object solution) containing PSA 1403 as a detection object is injected into the flow channel 1302 and incubated for 5 minutes.

(2) A phosphate buffered saline is flowed through the flow channel 1302 to remove any unreacted PSA 1403.

(3) A phosphate buffered saline containing a secondary antibody (anti-PSA antibody) 1404 labeled with the magnetic particles 1401 is injected into the flow channel 1302 and incubated for 5 minutes.

(4) Any unreacted labeled antibodies are cleaned off with a phosphate buffered saline.

Through this protocol, the magnetic particles 1401 are immobilized on the surface of the MI element 1200 through the action of the anti-PSA antibody 1404, the PSA 1403, and the primary antibody 1402. That is, if the PSA 1403 is absent in the detection object, the magnetic particles 1401 are not immobilized to the surface of the MI element 1200. Therefore, the PSA 1403 can be detected by detecting the presence or absence of the magnetic particles 1401.

Next, the procedures for measuring the magnetic particles 1401 are described.

Figure 13:
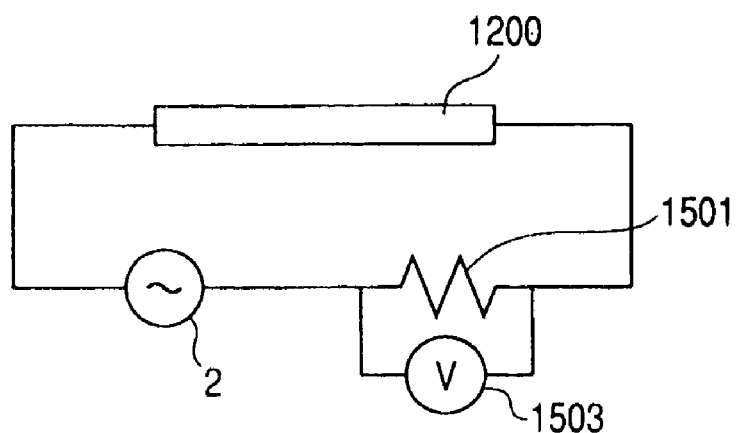
FIG. 13 is a circuit diagram illustrating a basic detecting circuit that uses the immunosensor illustrated in FIG. 9.

FIG. 13 illustrates a basic detecting circuit that uses an immunosensor. Referring to FIG. 13, the detecting circuit includes the MI element 1200, the alternating-current power supply 2 and a fixed resistor 1501 that are serially connected to the MI element 1200, and a voltmeter 1503 that detects a voltage at two ends of the fixed resistor 1501. By feeding an alternating current of 40 MHz to a Cu part provided in the center of the MI element 1200, a high frequency magnetic field is applied across the outer circumference of the MI element 1200.

Figure 14:
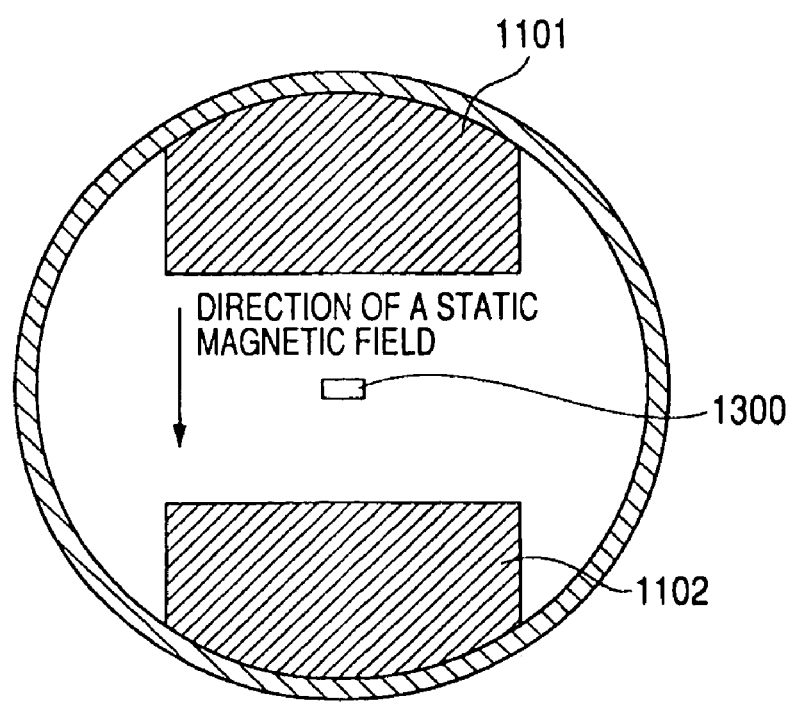
FIG. 14 is a schematic diagram that illustrates the structure of a magnetic substance detection apparatus that uses the immunosensor illustrated in FIG. 9.

FIG. 14 illustrates the structure of a magnetic substance detection apparatus that uses an immunosensor. In FIG. 14, a detecting section 1300 including the MI element 1200 is disposed midway between a magnetic pole 1101 and a magnetic pole 1102. However, FIG. 14 is a cross-sectional view, and the magnetic pole 1101, the magnetic pole 1102, and the detecting section 1300 are respectively elongated in the perpendicular direction with respect to the drawing.

The direction perpendicular to the housing surface is a direction in which detection of the magnetic field of the MI element 1200 is difficult. Therefore, a static magnetic field is applied in the direction perpendicular to the housing surface to align the magnetization directions of magnetic particles 1401 immobilized to the surface of the MI element 1200 in a substantially perpendicular direction.

Based on the size of the detection signal from the MI element 1200, the quantity of magnetic particles 1401 that are immobilized on the MI element 1200 can be determined, and therefore the amount of the antigen 1403 in the detection object can be indirectly determined.

In the immunosensor according to the present example, only one flow channel 1302 is provided in the housing 1301. However, the present invention is not limited thereto. A plurality of flow channels may be formed inside the housing 1301 and the detecting section 1300 can be provided in each flow channel in the state illustrated in FIG. 14. In this case, by allowing different antigen-antibody reactions to occur in the respective flow channels, a plurality of antigens can be detected at one time.

The frequency of an alternating current magnetic field used for measurement can be arbitrarily selected as long as a skin effect occurs in the MI element and measurement in a high-frequency mode is possible.

Further, the MI element 1200 may be made with magnetic material of a uniform composition without including a non-magnetic conductor.

In addition, the MI element 1200 may have a polygonal cross section that is symmetrical with respect to the center point thereof, in a direction intersecting with the longitudinal direction.

Example 2

An MI element forming an immunosensor may have a thin film structure. The MI element has a magnetic film (thin film) that is formed on a substrate. The MI element has an easy magnetization axis in a direction intersecting with the longitudinal direction of the magnetic film, i.e. a substantially vertical direction (predetermined direction), in the film plane of the magnetic film. This MI element is also a sensor element in which an impedance varies depending on the size of an applied magnetic field, and in which the magnetic film has a multi-magnetic domain structure in which a plurality of magnetic domains are adjacently formed along the longitudinal direction thereof. The affinity for a detection target substance in the vicinity of an odd-numbered magnetic domain wall surface and the affinity for a detection target substance in the vicinity of an even-numbered magnetic domain wall surface, when counting from either end of the MI element, are different. More specifically, the affinity for a detection target substance in the vicinity of either one of an odd-numbered or an even-numbered magnetic domain wall surface is higher than the affinity of the other.

Similar results as those of the immunosensor of the first example are obtained by the immunosensor including the MI element of the above structure. In this connection, in the immunosensor of the present example, a static magnetic field that is applied to align the magnetization of magnetic particles can be applied in a direction that is perpendicular to the film surface of the magnetic film.

According to the magnetic sensor element and the magnetic substance detection apparatus using the magnetic sensor element according to the present invention that are described above, an adherence position of a magnetic particle is limited to the element surface vicinity of an odd-numbered or an even-numbered magnetic domain wall portion. Hence, it is possible to suppress the occurrence of a state in which magnetic fields from magnetic particles cancel each other out inside a magnetic domain, and as a result a detection target substance (magnetic particle or non-magnetic substance having a magnetic particle as a label) can be detected at a high accuracy.

The above described exemplary embodiment is one example of the present invention, and the structure and action thereof can be appropriately changed within a range that does not depart from the spirit and scope of the invention.

In the drawings, reference numeral 1 denotes an MI element, reference numeral 2 denotes an alternating-current power supply, reference numeral 1190 denotes a magnetic domain, reference numeral 1191 denotes the direction of magnetization within a magnetic domain, reference numeral 1201 denotes a nonmagnetic conductor, reference numeral 1202 denotes a magnetic material, and reference numerals 1601 and 1602 respectively denote a magnetic domain wall surface vicinity.

The present invention can be used, for example, in DNA diagnosis in clinical laboratory testing.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-166109, filed Jun. 25, 2007 which is hereby incorporated by reference herein in its entirety.

The invention claimed is:

1. A magnetic sensor element comprising a multi-magnetic domain structure in which a plurality of magnetic domains extend in a row in one direction and in which the magnetic domains that are adjoining have easy magnetization axes in opposite directions to each other, wherein:

the multi-magnetic domain structure has a surface region, and within the surface region, when counting from one end of the multi-magnetic domain structure, affinities for a magnetic particle or a substance to be immobilized on the magnetic particle are mutually different at first surface portions located at a boundary between a (2n−1)th (n being a natural number) magnetic domain and a (2n)th magnetic domain and second surface portions located at a boundary between the (2n)th magnetic domain and a (2n+1)th magnetic domain and wherein the affinities of any of the first surface portions are higher or lower than the affinities of any of the second surface portions.

2. The magnetic sensor element according to claim 1, wherein:

the multi-magnetic domain structure comprises a columnar magnetic material, and the plurality of magnetic domains extend in a row along a longitudinal direction of the magnetic material; and the multi-magnetic domain structure has the easy magnetization axis in a circumferential direction of a cross-section of the magnetic material in a direction intersecting with the longitudinal direction.

3. The magnetic sensor element according to claim 2, wherein the cross-section shape is circular.

4. The magnetic sensor element according to claim 2, wherein the cross-section shape is a polygon that is point-symmetric about a center point of the cross-section.

5. The magnetic sensor element according to claim 1, wherein the multi-magnetic domain structure comprises a plurality of magnetic films that are laminated on a substrate, and has the easy magnetization axis in a direction intersecting with a lamination direction of the magnetic films.

6. The magnetic sensor element according to claim 1, wherein in the first surface portion is provided a film for selectively adhering the magnetic particle or the substance to be immobilized on the magnetic particle to a surface of the multi-magnetic domain structure.

7. The magnetic sensor element according to claim 1, wherein, in the second surface portion is provided a film that inhibits adhering of the magnetic particle or the substance to be immobilized on the magnetic particle to a surface of the multi-magnetic domain structure.

8. A detection apparatus, comprising:
a magnetic sensor element according to claim 1; and
an alternating-current power supply for supplying an alternating current to the magnetic sensor element,
wherein the detection apparatus detects a detection target substance utilizing a fact that an impedance of the magnetic sensor element changes depending on a size of a magnetic field imparted by the magnetic particle or the substance to be immobilized on the magnetic particle that is possessed by the detection target substance.

9. The detection apparatus according to claim 8, wherein the detection apparatus further includes a housing comprising an internal flow channel, and the magnetic sensor element is housed in the flow channel.

10. The detection apparatus according to claim 9, further including a static magnetic field applying unit for applying a static magnetic field to the magnetic sensor element.

* * * * *